US009054218B2

(12) United States Patent
Adam et al.

(10) Patent No.: US 9,054,218 B2
(45) Date of Patent: Jun. 9, 2015

(54) METHOD OF MANUFACTURING A FINFET DEVICE USING A SACRIFICIAL EPITAXY REGION FOR IMPROVED FIN MERGE AND FINFET DEVICE FORMED BY SAME

(71) Applicant: International Business Machines Corporation, Armonk, NY (US)

(72) Inventors: Thomas N. Adam, Slingerlands, NY (US); Kangguo Cheng, Schenectady, NY (US); Bruce B. Doris, Slingerlands, NY (US); Hong He, Schenectady, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/961,248

(22) Filed: Aug. 7, 2013

(65) Prior Publication Data

US 2015/0041908 A1 Feb. 12, 2015

(51) Int. Cl.
*H01L 21/336* (2006.01)
*H01L 21/8234* (2006.01)
*H01L 21/8238* (2006.01)
*H01L 21/84* (2006.01)
*H01L 27/092* (2006.01)
*H01L 29/66* (2006.01)
*H01L 27/088* (2006.01)
*H01L 27/12* (2006.01)

(52) U.S. Cl.
CPC .... *H01L 21/823821* (2013.01); *H01L 27/0924* (2013.01); *H01L 29/6681* (2013.01); *H01L 27/0886* (2013.01); *H01L 29/66795* (2013.01); *H01L 27/1211* (2013.01); *H01L 21/845* (2013.01); *H01L 21/823431* (2013.01)

(58) Field of Classification Search
CPC ............... H01L 21/823431; H01L 21/823821; H01L 21/845; H01L 27/0556; H01L 27/0924; H01L 27/1211; H01L 29/66795; H01L 29/6681
USPC ........................................................ 438/300
See application file for complete search history.

(56) References Cited

U.S. PATENT DOCUMENTS

| 7,361,958 | B2 * | 4/2008 | Brask et al. | 257/369 |
|---|---|---|---|---|
| 7,388,259 | B2 * | 6/2008 | Doris et al. | 257/351 |
| 8,116,121 | B2 * | 2/2012 | Kawasaki | 365/156 |
| 8,263,451 | B2 | 9/2012 | Su et al. | |
| 8,377,779 | B1 * | 2/2013 | Wang | 438/283 |
| 8,569,152 | B1 * | 10/2013 | Basker et al. | 438/478 |
| 8,586,455 | B1 * | 11/2013 | Chang et al. | 438/481 |
| 8,656,599 | B2 * | 2/2014 | Anderegg et al. | 30/410 |
| 8,716,156 | B1 * | 5/2014 | Pawlak et al. | 438/792 |
| 8,796,093 | B1 * | 8/2014 | Cheng et al. | 438/268 |
| 8,851,659 | B2 * | 10/2014 | Shiohara | 347/102 |
| 2005/0077553 | A1 | 4/2005 | Kim et al. | |

(Continued)

*Primary Examiner* — Mary Wilczewski
(74) *Attorney, Agent, or Firm* — Daniel P. Morris; Ryan, Mason & Lewis, LLP

(57) ABSTRACT

A method for manufacturing a fin field-effect transistor (FinFET) device comprises forming a plurality of fins on a substrate, epitaxially growing a sacrificial epitaxy region between the fins, stopping growth of the sacrificial epitaxy region at a beginning of merging of epitaxial shapes between neighboring fins, and forming a dielectric layer on the substrate including the fins and the sacrificial epitaxy region, wherein a portion of the dielectric layer is positioned between the sacrificial epitaxy region extending from fins of adjacent transistors.

16 Claims, 11 Drawing Sheets

(56) References Cited

U.S. PATENT DOCUMENTS

| | | |
|---|---|---|
| 2007/0111404 A1 | 5/2007 | Chen et al. |
| 2008/0206933 A1 | 8/2008 | Brownson et al. |
| 2012/0025316 A1* | 2/2012 | Schultz .................. 257/368 |
| 2012/0043610 A1 | 2/2012 | Cheng et al. |
| 2012/0126375 A1* | 5/2012 | Wang et al. .................. 257/623 |
| 2012/0276695 A1* | 11/2012 | Cheng et al. .................. 438/154 |
| 2012/0314485 A1 | 12/2012 | Cai et al. |
| 2013/0001705 A1 | 1/2013 | Su et al. |
| 2013/0020642 A1* | 1/2013 | Basker et al. .................. 257/347 |
| 2013/0187228 A1* | 7/2013 | Xie et al. .................. 257/347 |
| 2014/0103451 A1* | 4/2014 | Ouyang et al. .................. 257/401 |
| 2014/0106528 A1* | 4/2014 | Quyang et al. .................. 438/275 |
| 2014/0120678 A1* | 5/2014 | Shinriki et al. .................. 438/283 |
| 2014/0183605 A1* | 7/2014 | Mochizuki et al. .................. 257/288 |
| 2014/0203370 A1* | 7/2014 | Maeda et al. .................. 257/365 |
| 2014/0217517 A1* | 8/2014 | Cai et al. .................. 257/401 |
| 2014/0239395 A1* | 8/2014 | Basker et al. .................. 257/347 |
| 2014/0284719 A1* | 9/2014 | Khakifirooz et al. .................. 257/351 |
| 2014/0284760 A1* | 9/2014 | Cheng et al. .................. 257/528 |
| 2014/0291766 A1* | 10/2014 | Hafez et al. .................. 257/365 |

\* cited by examiner

METHOD OF MANUFACTURING A FINFET DEVICE USING A SACRIFICIAL EPITAXY REGION FOR IMPROVED FIN MERGE AND FINFET DEVICE FORMED BY SAME

TECHNICAL FIELD

The field generally relates to methods of manufacturing fin field-effect transistor (FinFET) devices and, in particular, to a method for manufacturing a FinFET device using a sacrificial epitaxy region for improved fin merge.

BACKGROUND

Epitaxy is often used to merge individual fins that belong to a single transistor in order to provide enough material in the source drain for silicidation as well as to relax the requirements on a contact. Conventional epitaxy processes are not self-limited. This means that there is a variation in epitaxy thickness based on the fin-to-fin spacing to ensure that all fins that need to be merged are merged.

However, there is a need to avoid unwanted shorts between neighboring transistors as well as a source to drain shorts caused by the merging of fins of different transistors, and the variation in the epitaxy thickness makes it difficult to design growth rates to avoid the unwanted shorts. Known methods have employed extra spacing between neighboring transistors.

In conventional faceted epitaxy growth, the point where the tips of the facets merge is a weak point from a silicide formation point of view as there is not enough material in these to be consumed during epitaxy.

Accordingly, there is a need for an improved method for fin merge that prevents the unwanted shorts while providing for an adequate merge of fins in a transistor.

SUMMARY

In general, exemplary embodiments of the invention include methods of manufacturing FinFET devices and, in particular, to a method for manufacturing a FinFET device using a sacrificial epitaxy region for improved fin merge.

According to an exemplary embodiment of the present invention, a method for manufacturing a fin field-effect transistor (FinFET) device comprises forming a plurality of fins on a substrate, epitaxially growing a sacrificial epitaxy region between the fins, stopping growth of the sacrificial epitaxy region at a beginning of merging of epitaxial shapes between neighboring fins, and forming a dielectric layer on the substrate including the fins and the sacrificial epitaxy region, wherein a portion of the dielectric layer is positioned between the sacrificial epitaxy region extending from fins of adjacent transistors.

According to an exemplary embodiment of the present invention, a fin field-effect transistor (FinFET) device comprises a substrate, a first plurality of fins on the substrate corresponding to a first transistor, a second plurality of fins on the substrate corresponding to a second transistor, a first epitaxy region extending between the first plurality of fins, a second epitaxy region extending between the second plurality of fins, and a dielectric layer on the substrate, wherein a portion of the dielectric layer is positioned between the first epitaxy region and the second epitaxy region preventing contact between the first epitaxy region and the second epitaxy region.

According to an exemplary embodiment of the present invention, a method for manufacturing a fin field-effect transistor (FinFET) device comprises forming a first plurality of fins on a substrate corresponding to a first transistor, forming a second plurality of fins on the substrate corresponding to a second transistor, epitaxially growing a sacrificial epitaxy region between the first plurality of fins corresponding to the first transistor and between the second plurality of fins corresponding to the second transistor, stopping growth of the sacrificial epitaxy region to avoid contact of the sacrificial epitaxy region between the first plurality of fins and the second plurality of fins, and forming a dielectric layer on the substrate between the sacrificial epitaxy region extending from adjacent fins of the first and second transistors.

These and other exemplary embodiments of the invention will be described or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION OF EXEMPLARY EMBODIMENTS

Exemplary embodiments of the invention will now be discussed in further detail with regard to methods of manufacturing FinFET devices and, in particular, to a method for manufacturing a FinFET device using a sacrificial epitaxy region for improved fin merge. This invention may, however, be embodied in many different forms and should not be construed as limited to the embodiments set forth herein.

The embodiments of the present invention include a replacement epitaxy process, where a sacrificial faceted epitaxy region is first grown to merge the fins. Then, a dielectric is deposited to cover the sacrificial epitaxy region. Trenches are opened in the dielectric, the sacrificial epitaxy is removed and its space is filled with the desired epitaxy.

It is to be understood that the various layers and/or regions shown in the accompanying drawings are not drawn to scale, and that one or more layers and/or regions of a type commonly used in FinFET devices may not be explicitly shown in a given drawing. This does not imply that the layers and/or regions not explicitly shown are omitted from the actual FinFET devices. Moreover, the same or similar reference numbers used throughout the drawings are used to denote the same or similar features, elements, or structures, and thus, a detailed explanation of the same or similar features, elements, or structures will not be repeated for each of the drawings.

The FinFET devices and methods for forming same in accordance with the embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the FinFET devices are contemplated embodiments of the invention. Given the teachings of the embodiments of the invention provided herein, one of ordinary skill in the art will be able to contemplate other implementations and applications of embodiments of the invention.

Figure 1:
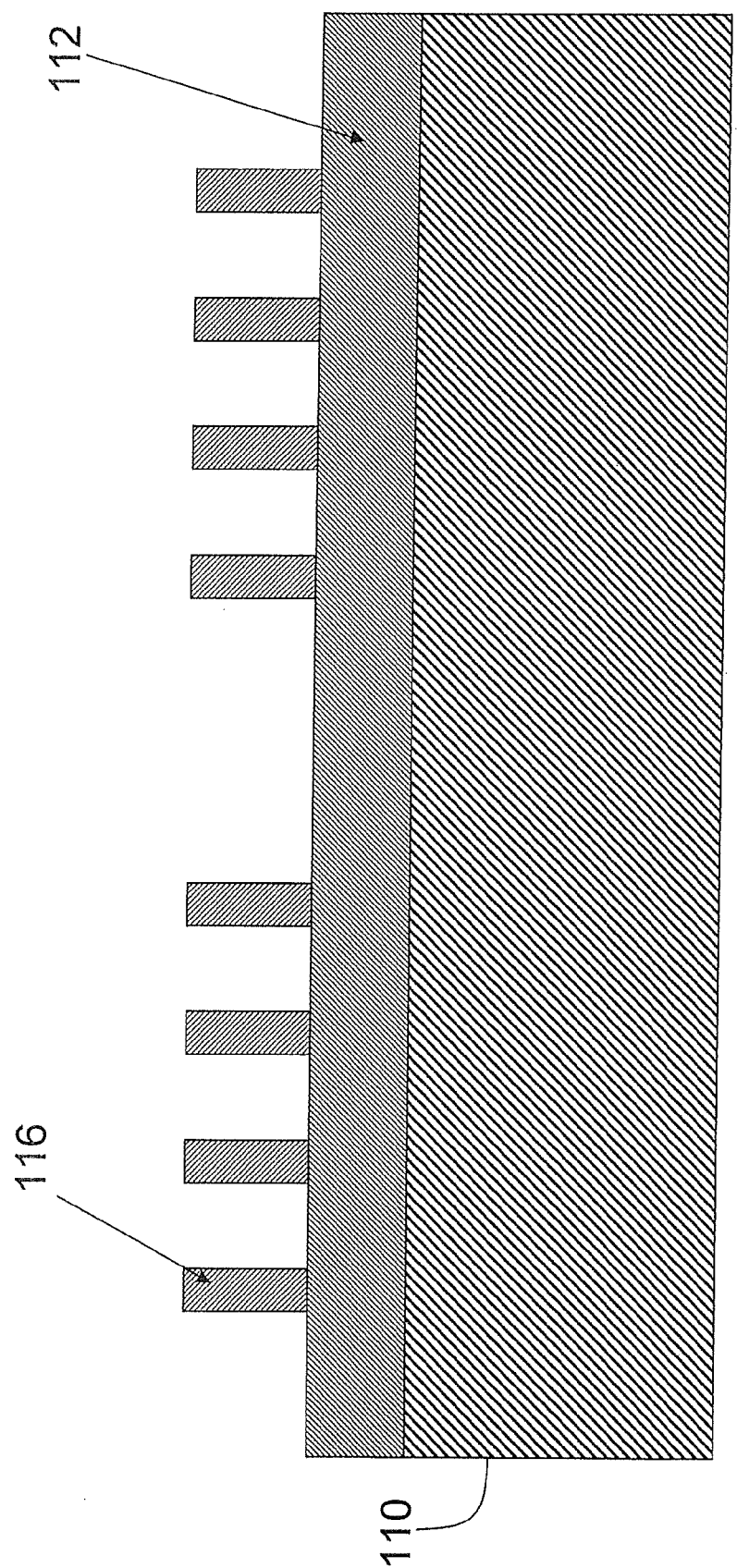
FIG. 1 is a cross-sectional view illustrating fin formation in a method of manufacturing a FinFET device, according to an exemplary embodiment of the present invention.

Referring to FIG. 1, which is a cross-sectional view illustrating fin formation in a method of manufacturing a FinFET device, according to an exemplary embodiment of the present invention, fins 116 are formed by patterning a silicon-on-insulator (SOI) layer. Patterning is performed by, for example, image transfer and etching. In FIG. 1, the cross-section is taken through the fins 116 in the source drain region. The fins 116 are formed on a buried oxide (BOX) layer 112, which is formed on a semiconductor substrate 110. It is to be understood that the embodiments of the invention are not limited to use of an SOI layer, and that the embodiments can be applied independent of the underlying substrate.

In accordance with an embodiment of the present invention, after formation of the fins 116, a gate stack layer (not shown) can be deposited and patterned to form gate stacks around sides and on upper surfaces of designated portions of the fins 116 for the gate areas. A spacer layer is also deposited and patterned by, for example, reactive ion etching (RIE) to form spacer patterns (not shown) along sides of the gate stacks.

Figure 2:
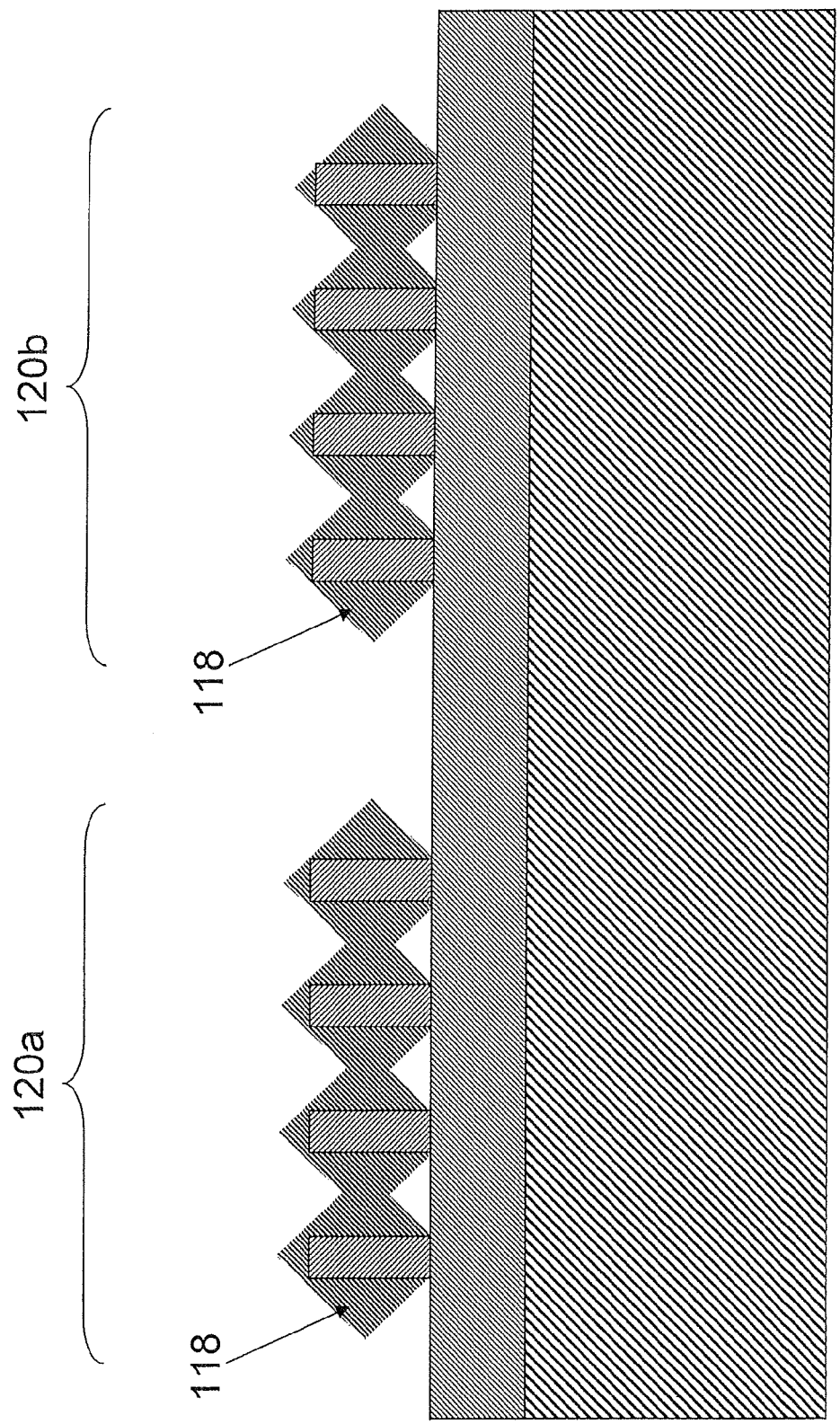
FIG. 2 is a cross-sectional view illustrating formation of a sacrificial epitaxy region in a method of manufacturing a FinFET device, according to an exemplary embodiment of the invention.

Referring to FIG. 2, which is a cross-sectional view illustrating formation of a sacrificial epitaxy region 118 in a method of manufacturing a FinFET device, according to an exemplary embodiment of the invention, the fins 116 are merged by epitaxially growing SiGe or other material having a relatively high etch selectivity with respect to silicon, such as, for example, germanium (Ge), so that the fins 116 contact each other via the epitaxy region 118 in an integrated structure. According to an embodiment, growth of the sacrificial epitaxy region 118 is stopped when or at some time after the sacrificial epitaxy region 118 between the fins 116 of a transistor 120a or 120b is merged as shown in FIG. 2 by the diamond shapes touching each other in each transistor 120a, 120b. The growth is stopped so that end fins of adjacent transistors are not merged via the sacrificial epitaxy region 118 (i.e., the sacrificial epitaxy regions 118 of separate transistors 120a and 120b are separated from each other and do not touch. According to an embodiment, to make sure that all fins that are desired to be merged are merged (e.g., fins of the same transistor), the growth thickness of the sacrificial epitaxy region 118 from each fin is larger than half of the fin-to-fin spacing. For example, the growth thickness may be greater than 15 nm for fins positioned at a 40 nm fin pitch in a transistor.

In accordance with an embodiment of the present invention, a maximum lateral growth of the sacrificial epitaxy region 118 is determined by the fin height. For example, given a (111) facet (using Miller Indices), the lateral growth of the sacrificial epitaxy region 118 is about equal to $$\frac{h_{fin}}{2(\sqrt{2})}, \tag{1}$$

where $h_{fin}$ is the height of the fin.

In accordance with an embodiment, the growth of the sacrificial epitaxy region 118 does not exceed a pre-determined time period so that growth can be stopped once or at some time after the sacrificial epitaxy region 118 between the fins 116 of a transistor 120a or 120b is merged, and prior to contact of the sacrificial epitaxy region between fins of adjacent transistors. In accordance with an embodiment, the sacrificial epitaxy region on the fin forms a diamond shape, and with enough time the diamond shape grows bigger and merges with a neighboring diamond shape. According to an embodiment, growth can be stopped at a beginning of merging, such as immediately or shortly after merging of neighboring epitaxial shapes occurs.

Figure 3:
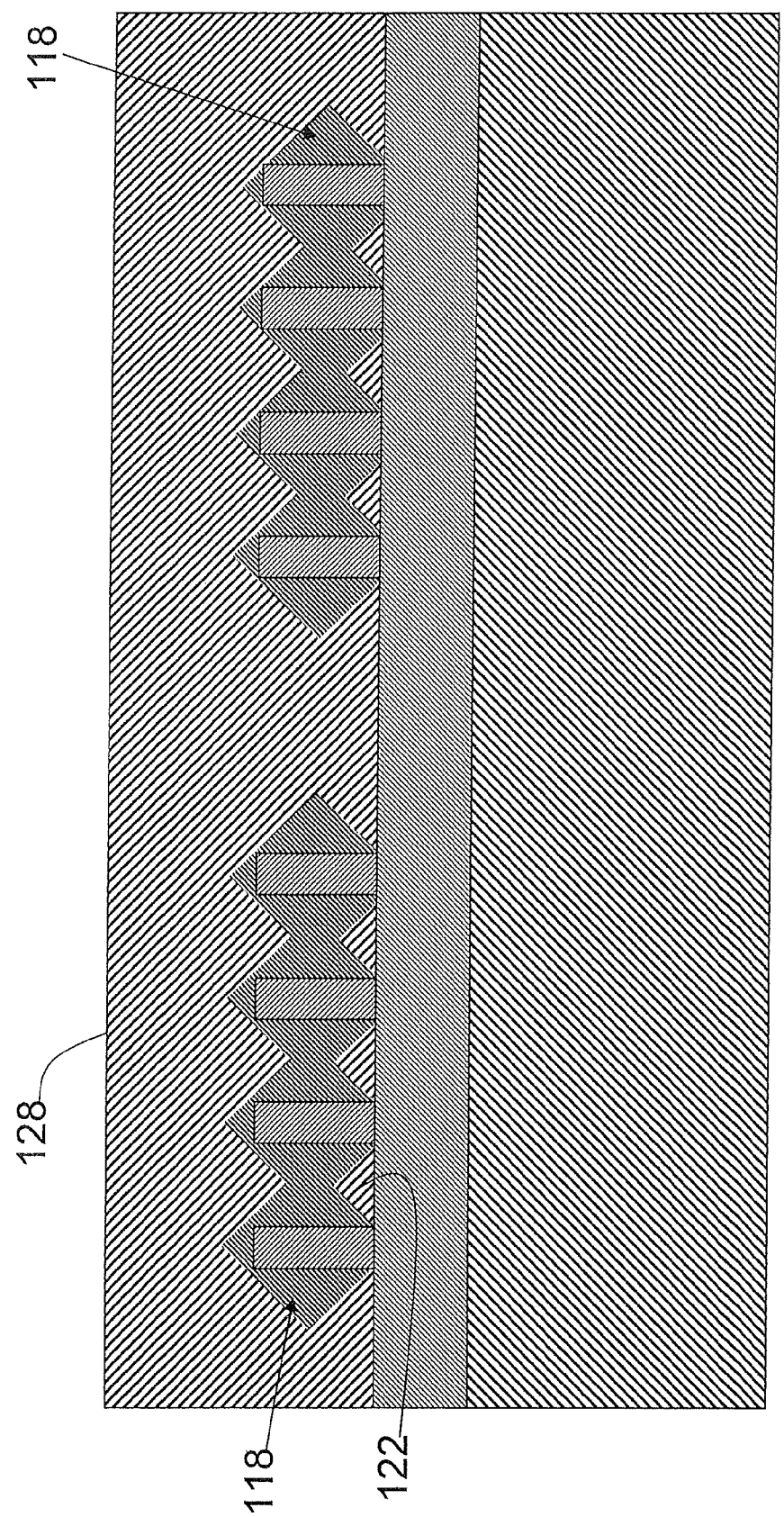
FIG. 3 is a cross-sectional view illustrating deposition of a dielectric in a method of manufacturing a FinFET device, according to an exemplary embodiment of the invention.

Referring to FIG. 3, which is a cross-sectional view illustrating deposition of a dielectric in a method of manufacturing a FinFET device, according to an exemplary embodiment of the invention, a dielectric layer 128, for example, an oxide, is formed on the substrate 110 including the BOX layer 112, fins 116 and sacrificial epitaxy region 118. In accordance with an embodiment of the present invention, lower gaps 122 between the fins 116 that are not filled by the sacrificial epitaxy region 118 are filled by the dielectric layer 128. Alternatively, the lower gaps 122 are not filled by the sacrificial epitaxy region 118, and are left open. According to an embodiment, the dielectric layer 128 is planarized down to a top of the gate structure, using, for example, chemical mechanical polishing (CMP).

Figure 4:
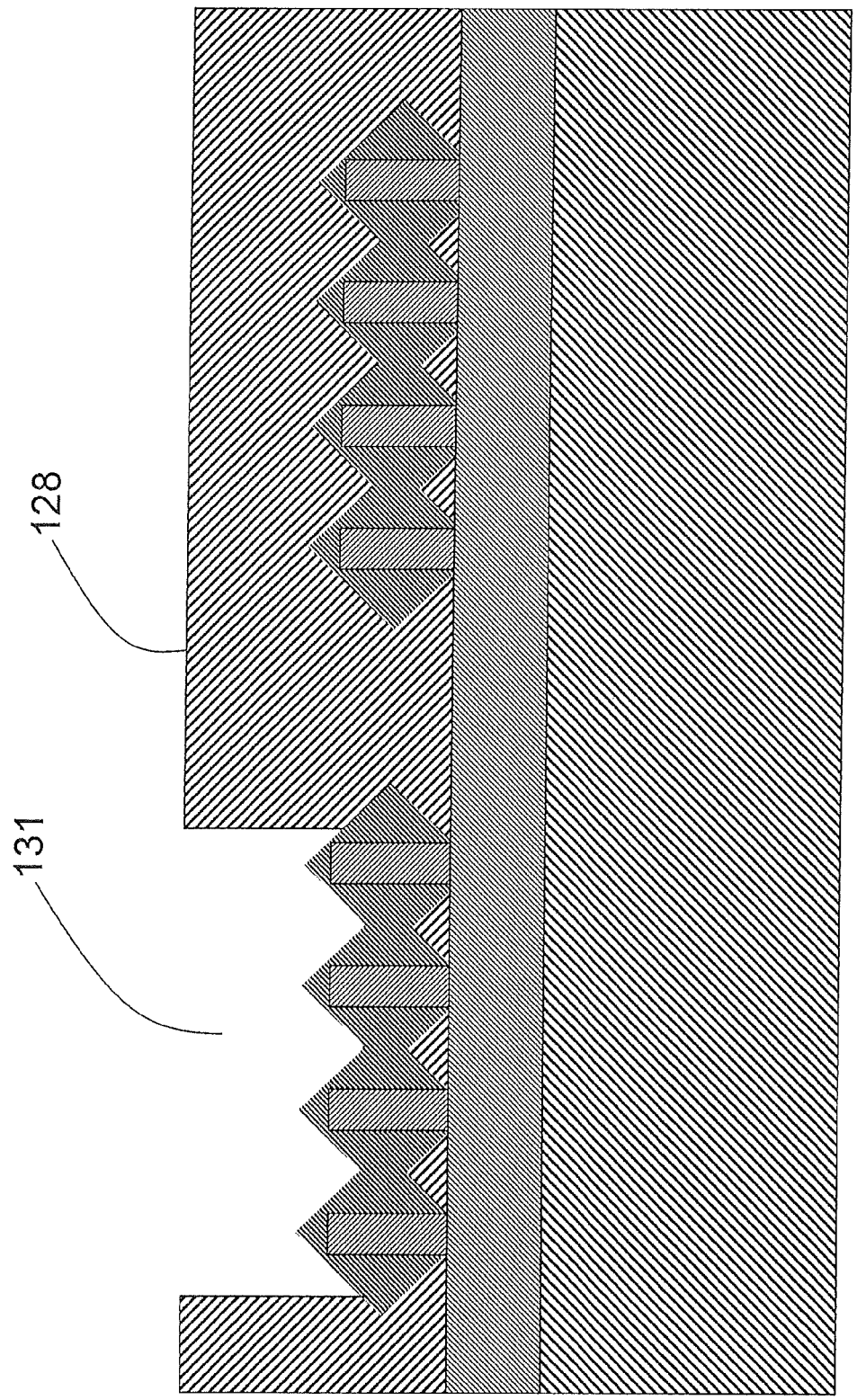
FIG. 4 is a cross-sectional view showing opening of a trench in a dielectric layer in a method of manufacturing a FinFET device, according to an exemplary embodiment of the invention.

Referring to FIG. 4, which is a cross-sectional view showing opening of a trench in a dielectric layer in a method of manufacturing a FinFET device, according to an exemplary embodiment of the invention, a portion of the dielectric layer 128 corresponding to a first transistor 120a is removed by, for example, etching, such as, for example, reactive ion etching (RIE) to form a trench 131. According to an embodiment, the transistor 120a is an NFET transistor. The trench 131 is an opening formed to expose the sacrificial epitaxy region 118 for transistor 120a.

Figure 5:
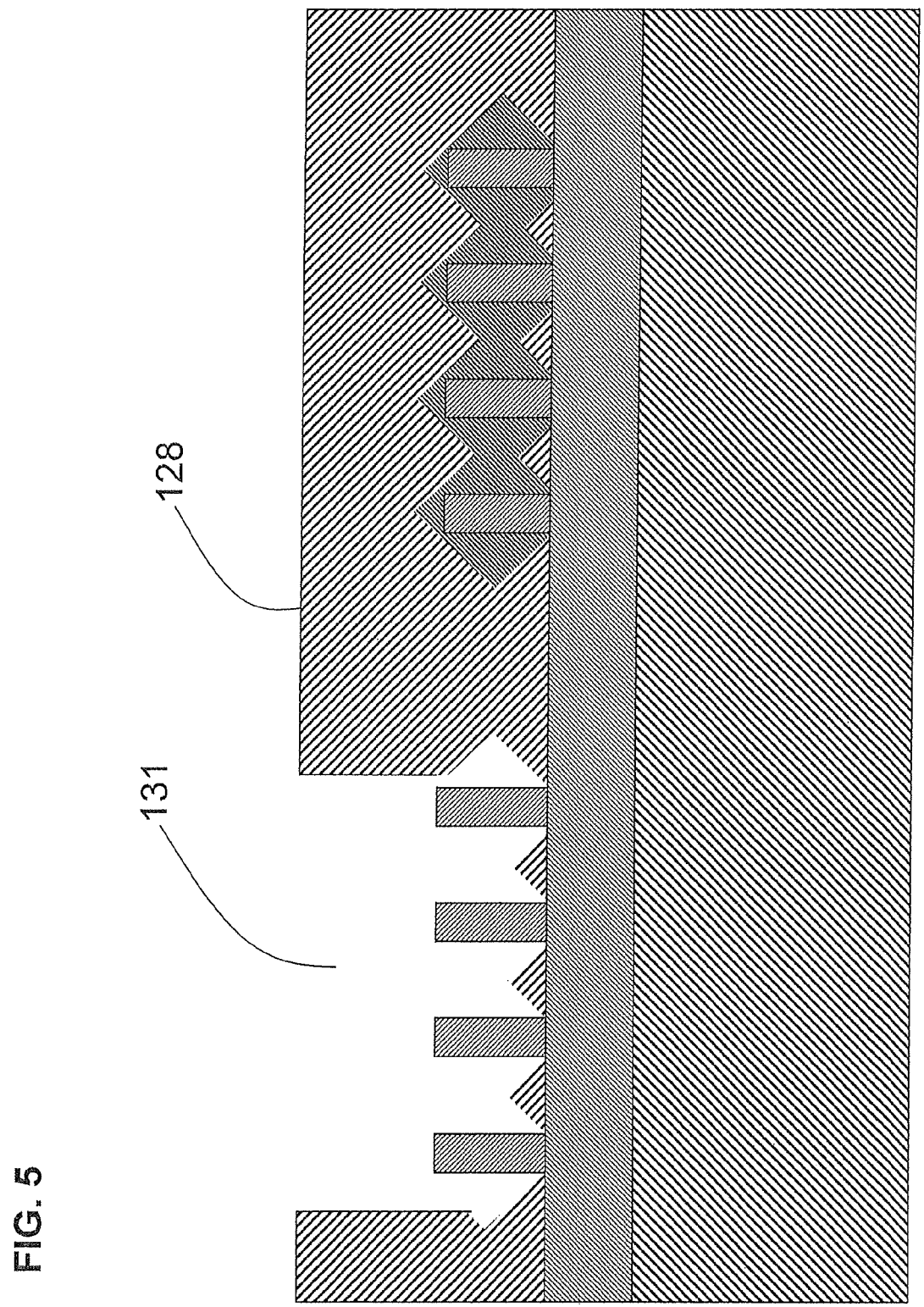
FIG. 5 is a cross-sectional view showing removal of a sacrificial epitaxy region in a method of manufacturing a FinFET device, according to an exemplary embodiment of the invention.

Referring to FIG. 5, which is a cross-sectional view showing removal of a sacrificial epitaxy region in a method of manufacturing a FinFET device, according to an exemplary embodiment of the invention, the sacrificial epitaxy region 118 corresponding to the transistor 120a is removed by etching. Etching can include, wet and/or dry etch processes. For example, a wet etch with hot ammonia can be used, or an HCl gas etch can be used. In one embodiment, the HCl gas etch can be done immediately prior to the deposition of the second (or final epitaxy) in the same epitaxial reactor where the final epitaxial deposition is performed. According to an embodiment of the present invention, after trench opening and cleans, the wafer is introduced into the epitaxial reactor, HCl gas etch is employed to remove the sacrificial epitaxy SiGe around the fins, and the final epitaxy is grown after that. The process ensures increased or maximum cleanliness and improved or best epitaxial quality, since the fins are not exposed to ambient air after sacrificial SiGe removal. Both mentioned wet and dry etches are selective to the dielectric.

Figure 6:
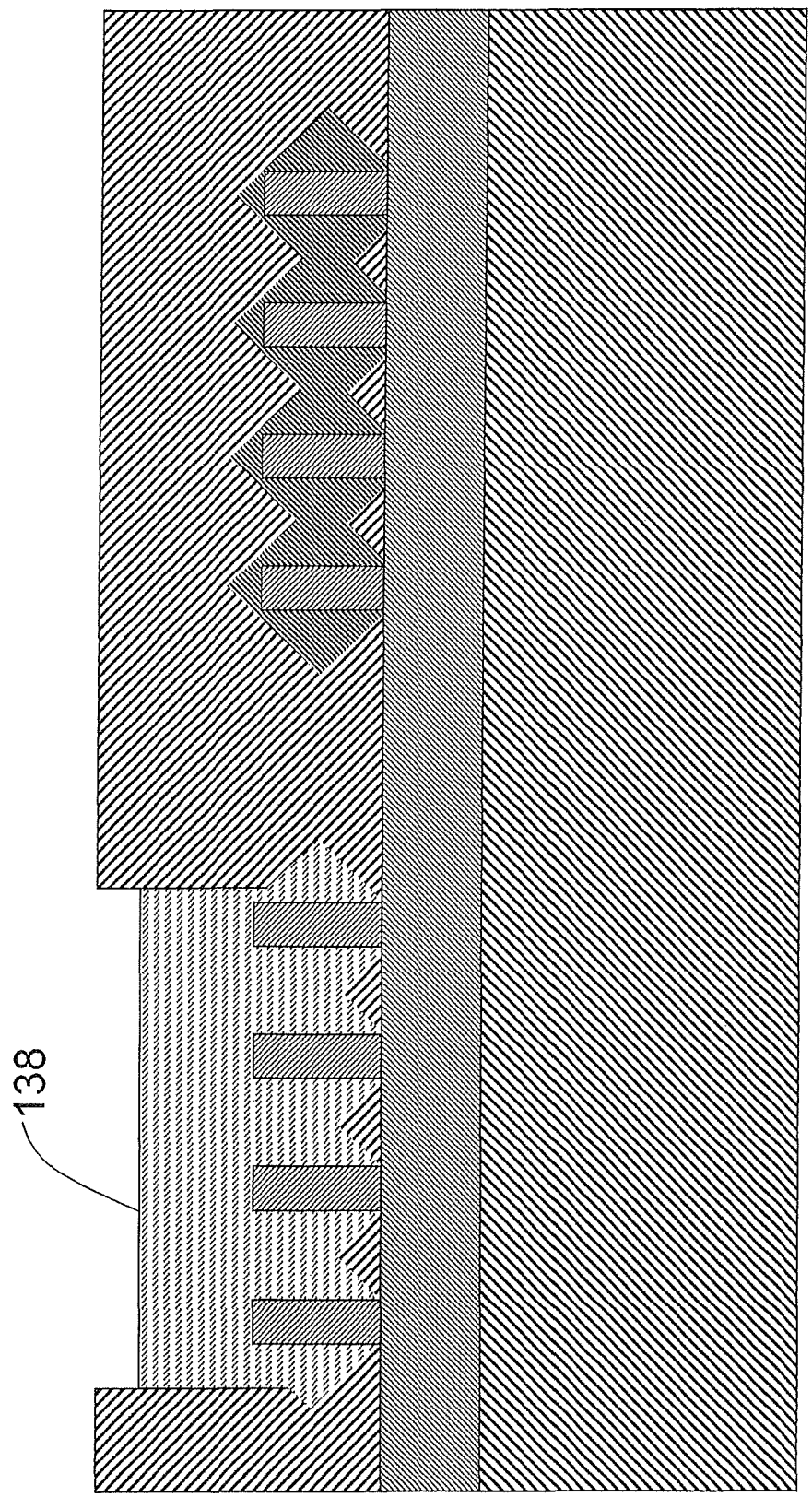
FIG. 6 is a cross-sectional view showing formation of an epitaxy region for a transistor in a method of manufacturing a FinFET device, according to an exemplary embodiment of the invention.

Referring to FIG. 6, which is a cross-sectional view showing formation of an epitaxy region for a transistor in a method of manufacturing a FinFET device, according to an exemplary embodiment of the invention, epitaxy region 138 is grown for transistor 120a in the space previously occupied by the sacrificial epitaxy region 118. As can be seen, the epitaxy region 138 further can be overgrown (e.g., grown higher above a top surface of the fins 116) to result in a smooth top surface of the epitaxy region 138. According to an embodiment, the height above a top surface of the fins 116 can be in the range of about 10 nm to about 20 nm. A height higher than about 20 nm can result in a gate capacitance penalty. Due to the presence of the dielectric layer 128, the epitaxy region 138 is prevented from excessive lateral growth from end fins. As a result, an epitaxy region 138 is blocked by the dielectric layer 128 and does not extend to connect fins from adjacent transistors (e.g., 120a and 120b). Thereby, shorts between neighboring transistors as well as source to drain shorts can be prevented.

According to an embodiment, the epitaxy region 138 is for an NFET. Embodiments of the present invention form epitaxy regions for transistors with the same doping at the same time, while shielding transistors with different doping. For example, epitaxy regions for transistors with the same doping as transistor 120a (in this case n-type) can be formed at the same time, while transistors with the same doping as transistor 120b (in this case p-type) remain covered. It is to be understood that doping of the transistors 120a and 120b can be reversed.

The fins 116 forming the source drain region of transistor 120a (in this case an NFET) are merged by epitaxially growing Si:P (phosphorus doped silicon), Si:C(P) on the exposed silicon surfaces of the fins 116 so that the fins 116 contact each other through the epitaxy region 138 in an integrated structure. Si:C(P)=epitaxial silicon with carbon and phosphorous doping. In one embodiment, a crystalline semiconductor layer may include carbon doped silicon with an atomic carbon concentration of between about 0.2% to about 4.0% substitutional carbon. In another embodiment, a crystalline semiconductor layer may include a carbon doped silicon type material having a concentration of about 0.3% to about 2.5% substitutional carbon. It is to be understood that the total amount of carbon in a crystalline semiconductor layer may be higher than the substitutional amount. Another material could be phosphorus doped SiGe, with Ge % less than 10% to promote phosphorus incorporation. Si:C(P) allows for the application of a strain on the structure (fin). According to an embodiment, merging is performed with epitaxial in-situ phosphorus (as mentioned above) or arsenic doped silicon. In another alternative embodiment, merging is performed and subsequent ion implantation can follow the epitaxial merging process. The doping level can be about $1.0 \times 10^{20}$ cm$^{-3}$ to about $2.0 \times 10^{21}$ cm$^{-3}$, for example, about $4.0 \times 10^{20}$ cm$^{-3}$ to about $9.0 \times 10^{20}$ cm$^{-3}$.

Figure 7:
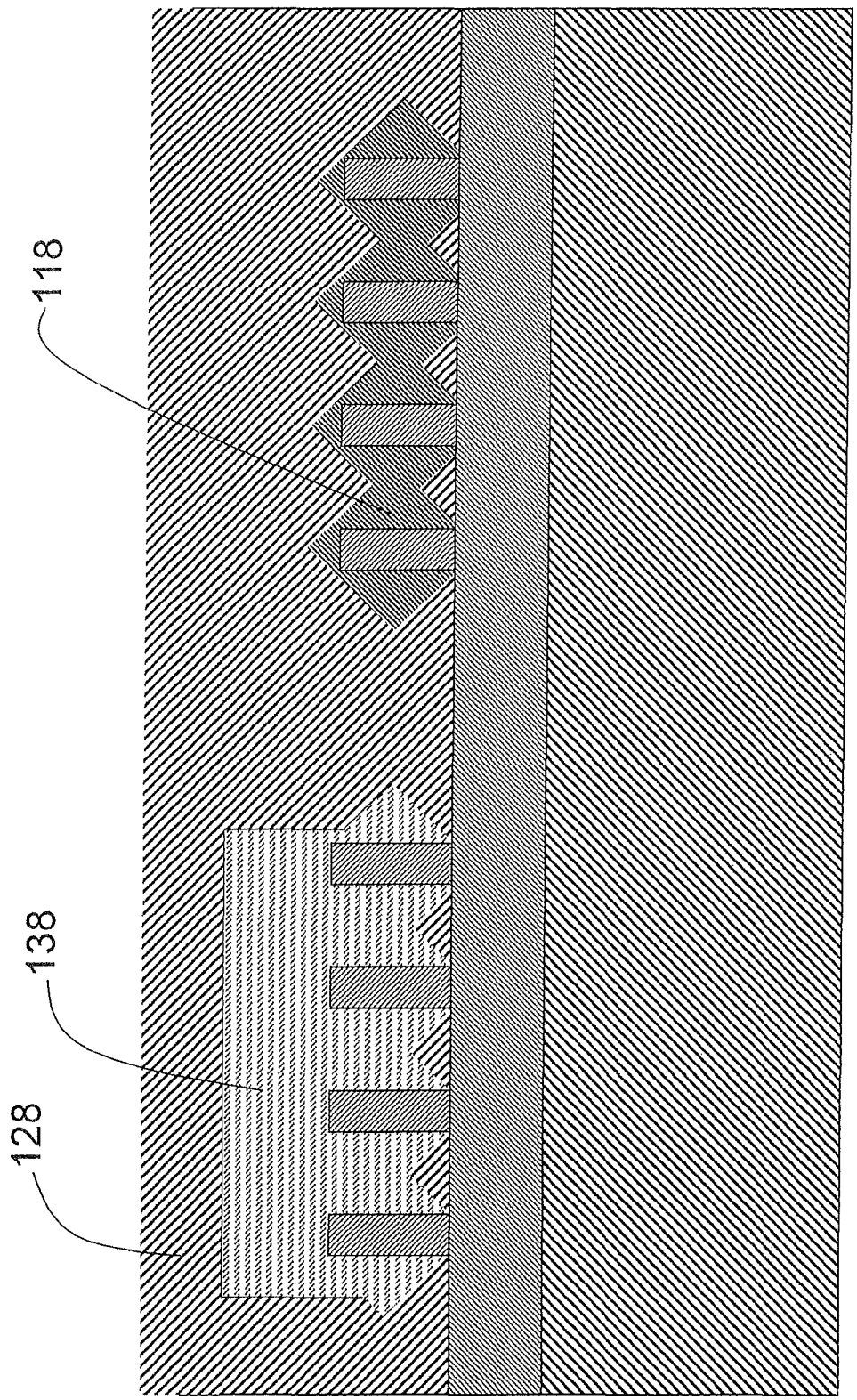
FIG. 7 is a cross-sectional view illustrating further deposition of a dielectric in a method of manufacturing a FinFET device, according to an exemplary embodiment of the invention.
Figure 8:
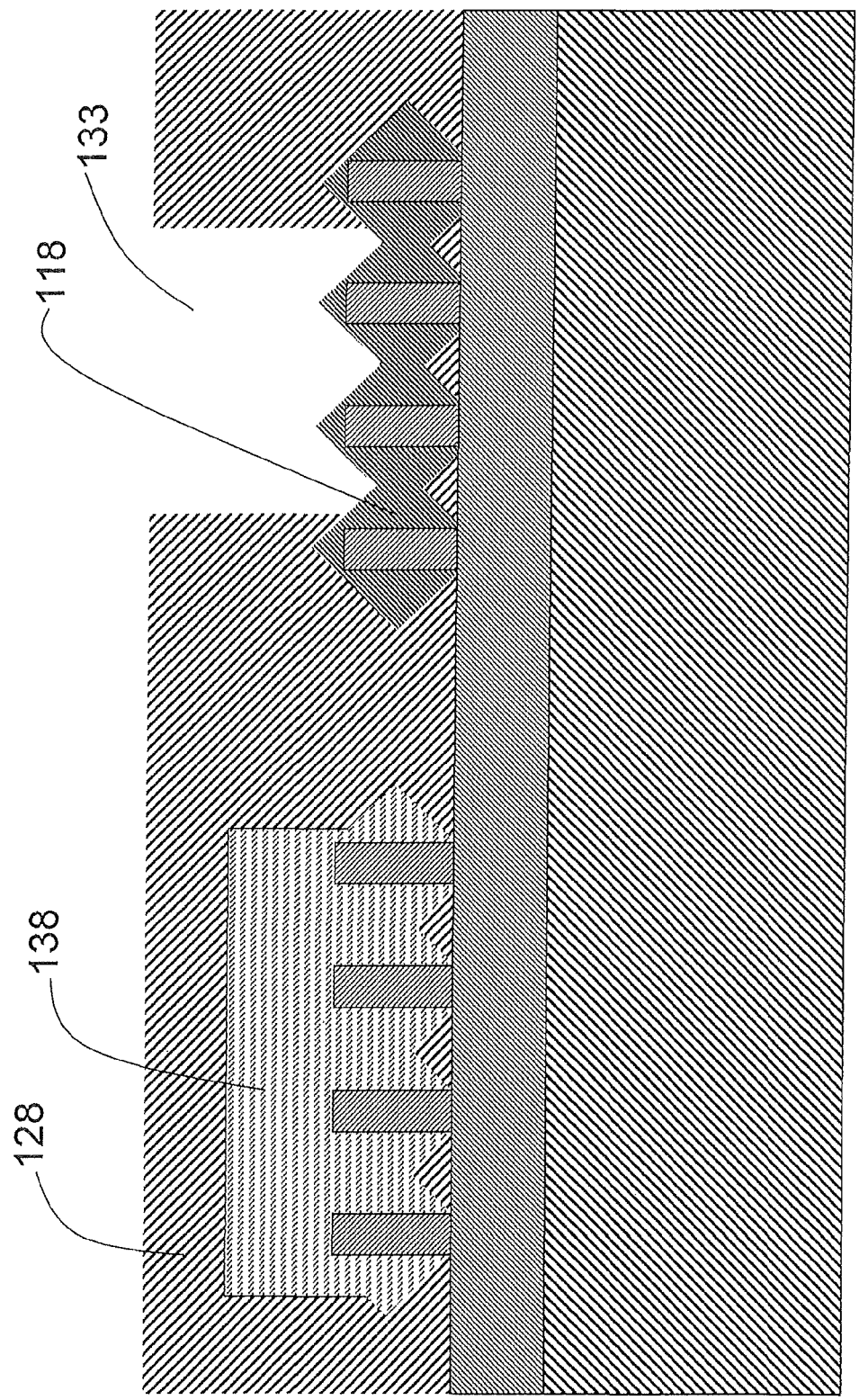
FIG. 8 is a cross-sectional view showing opening of a trench in a dielectric layer in a method of manufacturing a FinFET device, according to an exemplary embodiment of the invention.

Referring to FIG. 7, which is a cross-sectional view illustrating further deposition of a dielectric in a method of manufacturing a FinFET device, according to an exemplary embodiment of the invention, the dielectric layer 128 is deposited on the structure from FIG. 6 to cover epitaxy region 138, and chemical mechanical planarization (CMP) is performed to level the dielectric layer surface. Then, referring to FIG. 8, a portion of the dielectric layer 128 corresponding to a second transistor 120b is removed by, for example, etching, such as, for example, RIE to form a trench 133. According to an embodiment, the transistor 120b is a PFET transistor. The trench 133 is an opening formed to expose the sacrificial epitaxy region 118 for transistor 120b. As can be seen in FIG. 8, in accordance with an embodiment of the present invention, the trench does not necessarily overlap all of the fins for a transistor. According to an embodiment, while the trench can be large enough to overlap all of the fins, it is sufficient that the trench be large enough to remove the sacrificial epitaxy region 118 and fill the resulting gaps with the final epitaxy region. In connection with FIG. 8, the trench 133 overlaps some, but not all of the fins 116 for transistor 120b, but still permits removal of the sacrificial epitaxy region and growth of the final epitaxy region.

Figure 9:
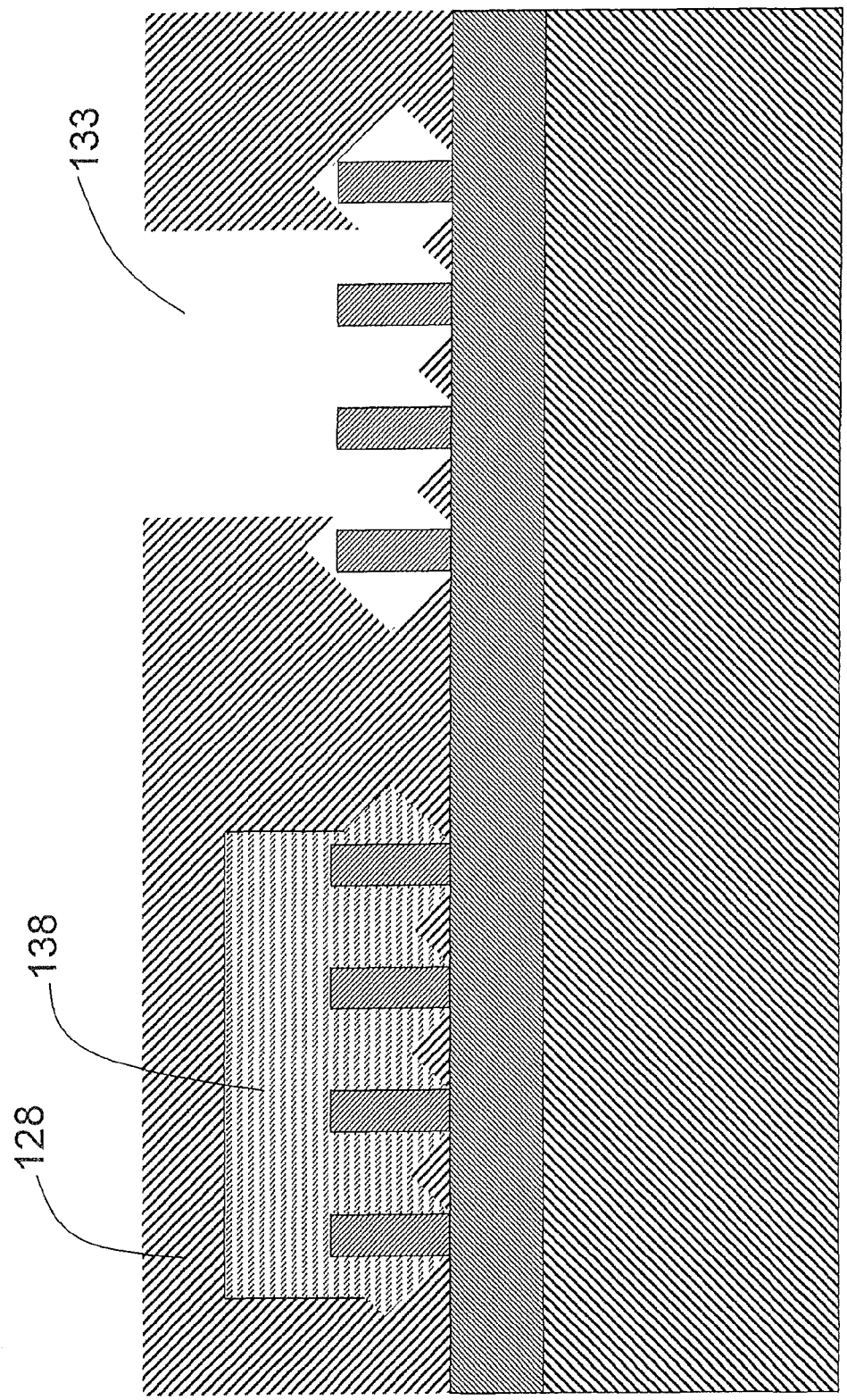
FIG. 9 is a cross-sectional view showing removal of a sacrificial epitaxy region in a method of manufacturing a FinFET device, according to an exemplary embodiment of the invention.

Referring to FIG. 9, which is a cross-sectional view showing removal of a sacrificial epitaxy region in a method of manufacturing a FinFET device, according to an exemplary embodiment of the invention, the sacrificial epitaxy region 118 corresponding to the transistor 120b is removed by, for example, etching. Etching can include, wet and/or dry etch processes such as those described in connection with FIG. 5.

Figure 10:
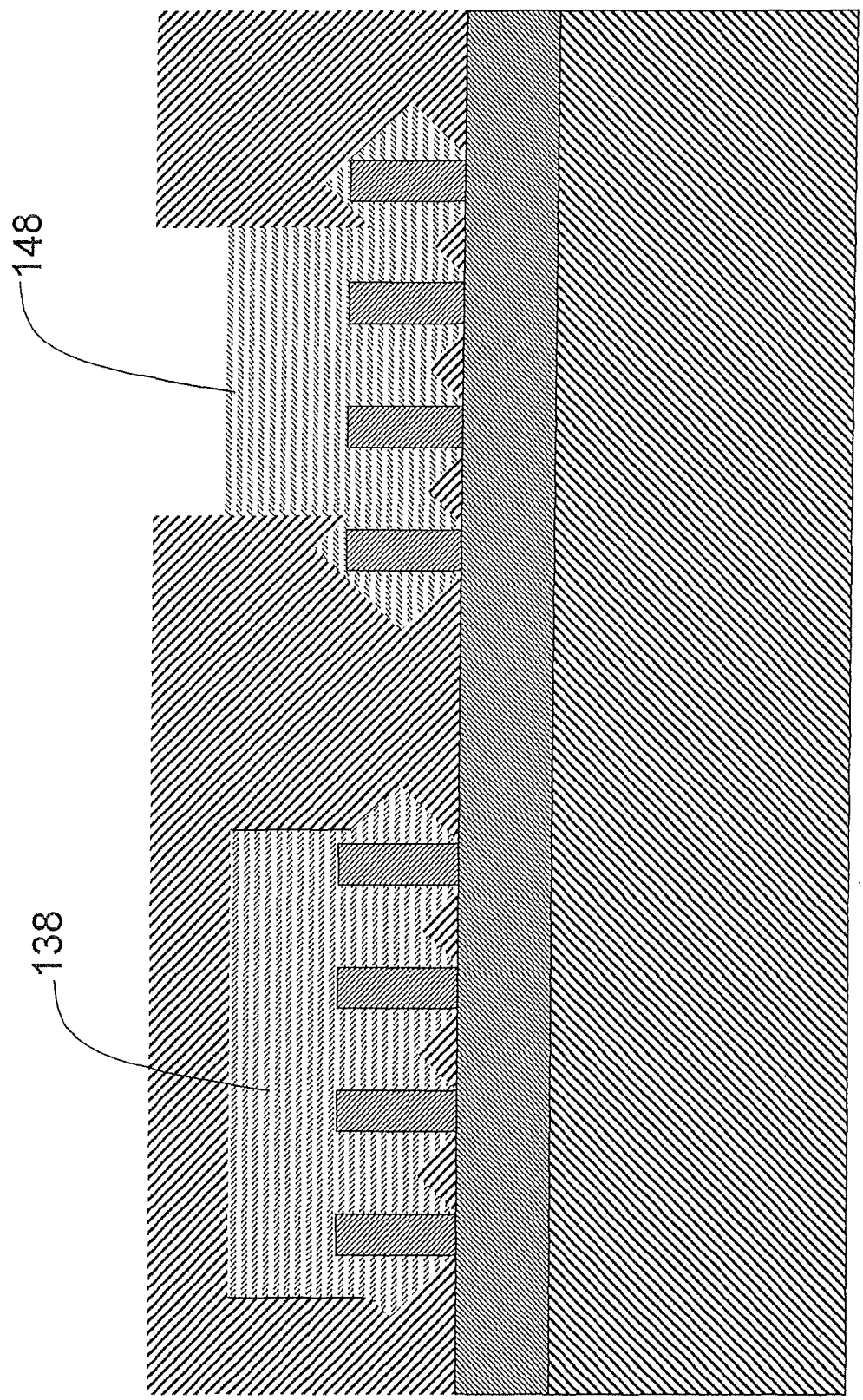
FIG. 10 is a cross-sectional view showing formation of an epitaxy region for a transistor in a method of manufacturing a FinFET device, according to an exemplary embodiment of the invention.

Referring to FIG. 10, which is a cross-sectional view showing formation of an epitaxy region for a transistor in a method of manufacturing a FinFET device, according to an exemplary embodiment of the invention, epitaxy region 148 is grown for transistor 120b in the space previously occupied by the sacrificial epitaxy region 118. As can be seen, the epitaxy region 148 can further be overgrown (e.g., grown relatively high above a top surface of the fins 116) to result in a smooth top surface of the epitaxy region 148. Due to the presence of the dielectric layer 128, like the epitaxy region 138, the epitaxy region 148 is prevented from excessive lateral growth from end fins. As a result, the epitaxy region 148 is blocked by the dielectric layer 128 and does not extend to connect fins from adjacent transistors (e.g., 120a and 120b). Thereby, shorts between neighboring transistors as well as source to drain shorts can be prevented.

According to an embodiment, the epitaxy region 148 is for a PFET. Epitaxy regions for transistors with the same doping as transistor 120b (in this case p-type) can be formed at the same time, while transistors with the same doping as transistor 120a (in this case n-type) remain covered.

The fins 116 forming the source drain region of transistor 120b (in this case an PFET) are merged by epitaxially growing in-situ boron doped SiGe (may include an introduced strain or Si) on the exposed silicon surfaces of the fins 116 so that the fins 116 contact each other through the epitaxy region 148 in an integrated structure. According to an embodiment, merging is performed with epitaxial in-situ boron doped silicon. The epitaxy region 148 can be in-situ doped with boron or other appropriate impurity. In another alternative embodiment, merging is performed and subsequent ion implantation can follow the epitaxial merging process. The doping level can be about $1.0 \times 10^{20}$ cm$^{-3}$ to about $2.0 \times 10^{21}$ cm$^{-3}$, for example about $4.0 \times 10^{20}$ cm$^{-3}$ to about $9.0 \times 10^{20}$ cm$^{-3}$.

Figure 11:
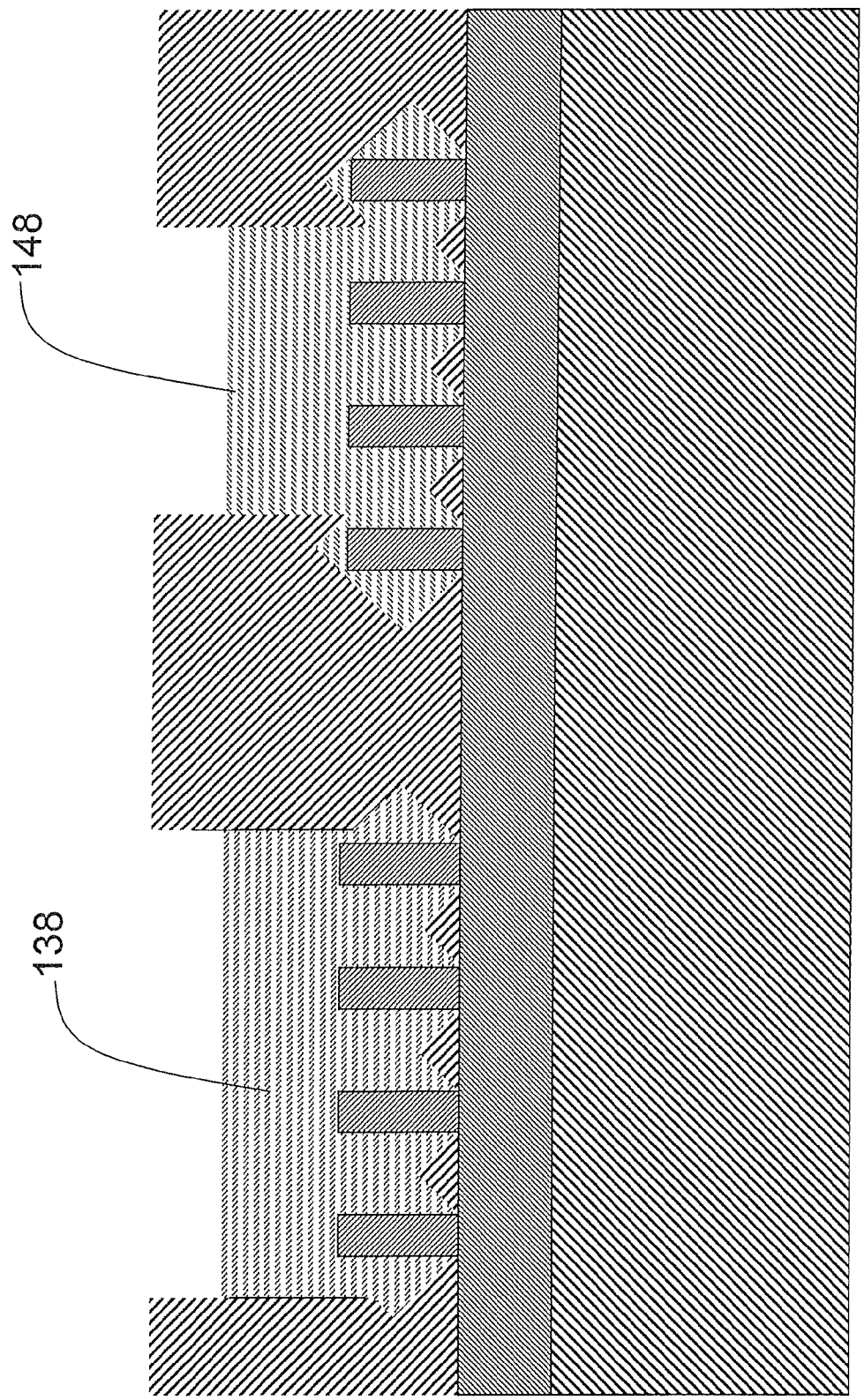
FIG. 11 is a cross-sectional view showing removal of a portion of a dielectric layer in a method of manufacturing a FinFET device, according to an exemplary embodiment of the invention.

Referring to FIG. 11, after formation of the structure shown in FIG. 10, the portion of the dielectric layer 128 over the transistor 120a is removed, and remaining processes for forming the FinFET devices can be performed, including, but not limited to, silicide and contact formation, replacement metal gate (RMG), and back-end-of-line (BEOL) processes.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a fin field-effect transistor (FinFET) device, the method comprising:
    forming a plurality of fins on a substrate;
    epitaxially growing a sacrificial epitaxy region between the fins;
    stopping growth of the sacrificial epitaxy region at a beginning of merging of epitaxial shapes between neighboring fins; and
    forming a dielectric layer on the substrate including the fins and the sacrificial epitaxy region, wherein a portion of the dielectric layer is positioned between the sacrificial epitaxy region extending from fins of adjacent transistors; and
    removing a portion of the dielectric layer corresponding to a first transistor to form an opening in the dielectric layer exposing at least part of the sacrificial epitaxy region extending from fins of the first transistor, wherein the opening is over an entire merged epitaxial shape between at least two neighboring fins, and over each of the at least two neighboring fins.

2. The method according to claim 1, wherein the sacrificial epitaxy region between fins of a same transistor merges the fins with each other.

3. A method for manufacturing a fin field-effect transistor (FinFET) device, the method comprising:
    forming a plurality of fins on a substrate;
    epitaxially growing a sacrificial epitaxy region between the fins;
    stopping growth of the sacrificial epitaxy region at a beginning of merging of epitaxial shapes between neighboring fins;
    forming a dielectric layer on the substrate including the fins and the sacrificial epitaxy region, wherein a portion of the dielectric layer is positioned between the sacrificial epitaxy region extending from fins of adjacent transistors;
    removing a portion of the dielectric layer corresponding to a first transistor to form an opening in the dielectric layer exposing at least part of the sacrificial epitaxy region extending from fins of the first transistor; and
    removing the sacrificial epitaxy region extending from the fins of the first transistor.

4. The method according to claim 3, wherein a sacrificial epitaxy region extending from fins of a second transistor remains covered by the dielectric layer during removal of the sacrificial epitaxy region extending from the fins of the first transistor.

5. The method according to claim 3, further comprising growing an epitaxy region for the first transistor in a space previously occupied by the removed sacrificial epitaxy region.

6. A method for manufacturing a fin field-effect transistor (FinFET) device, the method comprising:
    forming a plurality of fins on a substrate;
    epitaxially growing a sacrificial epitaxy region between the fins;
    stopping growth of the sacrificial epitaxy region at a beginning of merging of epitaxial shapes between neighboring fins;
    forming a dielectric layer on the substrate including the fins and the sacrificial epitaxy region, wherein a portion of the dielectric layer is positioned between the sacrificial epitaxy region extending from fins of adjacent transistors;
    removing a portion of the dielectric layer corresponding to a first transistor to form an opening in the dielectric layer exposing at least part of the sacrificial epitaxy region extending from fins of the first transistor; and
    removing the sacrificial epitaxy region extending from the fins of the first transistor;
    wherein a sacrificial epitaxy region extending from fins of a second transistor remains covered by the dielectric layer during removal of the sacrificial epitaxy region extending from the fins of the first transistor; and
    wherein the first and second transistors are doped differently.

7. A method for manufacturing a fin field-effect transistor (FinFET) device, the method comprising:
    forming a plurality of fins on a substrate;
    epitaxially growing a sacrificial epitaxy region between the fins;
    stopping growth of the sacrificial epitaxy region at a beginning of merging of epitaxial shapes between neighboring fins;
    forming a dielectric layer on the substrate including the fins and the sacrificial epitaxy region, wherein a portion of the dielectric layer is positioned between the sacrificial epitaxy region extending from fins of adjacent transistors;
    removing a portion of the dielectric layer corresponding to a first transistor to form an opening in the dielectric layer exposing at least part of the sacrificial epitaxy region extending from fins of the first transistor;
    removing the sacrificial epitaxy region extending from the fins of the first transistor;
    growing an epitaxy region for the first transistor in a space previously occupied by the removed sacrificial epitaxy region; and
    overgrowing the epitaxy region for the first transistor.

8. A method for manufacturing a fin field-effect transistor (FinFET) device, the method comprising:
    forming a plurality of fins on a substrate;
    epitaxially growing a sacrificial epitaxy region between the fins;
    stopping growth of the sacrificial epitaxy region at a beginning of merging of epitaxial shapes between neighboring fins;
    forming a dielectric layer on the substrate including the fins and the sacrificial epitaxy region, wherein a portion of the dielectric layer is positioned between the sacrificial epitaxy region extending from fins of adjacent transistors;
    removing a portion of the dielectric layer corresponding to a first transistor to form an opening in the dielectric layer exposing at least part of the sacrificial epitaxy region extending from fins of the first transistor;
    removing the sacrificial epitaxy region extending from the fins of the first transistor;
    growing an epitaxy region for the first transistor in a space previously occupied by the removed sacrificial epitaxy region; and depositing a dielectric layer on the epitaxy region for the first transistor.

9. The method according to claim 8, further comprising removing a portion of the dielectric layer corresponding to a second transistor to form a second opening in the dielectric layer exposing at least part of the sacrificial epitaxy region extending front fins of the second transistor.

10. The method according to claim 9, further comprising removing the sacrificial epitaxy region extending from the fins of the second transistor.

11. The method according to claim 10, wherein the epitaxy region for the first transistor remains covered by the dielectric layer during removal of the sacrificial epitaxy region extending from fins of the second transistor.

12. The method according to claim 11, wherein the first and second transistors are doped differently.

13. The method according to claim 10, further comprising growing an epitaxy region for the second transistor in a space previously occupied by the removed sacrificial epitaxy region from the second transistor.

14. The method according to claim 13, further comprising overgrowing the epitaxy region for the second transistor.

15. A method for manufacturing a fin field-effect transistor (FinFET) device, the method comprising:

forming a first plurality of fins on a substrate corresponding to a first transistor;

forming a second plurality of fins on the substrate corresponding to a second transistor;

epitaxially growing a sacrificial epitaxy region between the first plurality of fins corresponding to the first transistor and between the second plurality of fins corresponding to the second transistor;

stopping growth of the sacrificial epitaxy region to avoid contact of the sacrificial epitaxy region between the first plurality of fins and the second plurality of fins;

forming a dielectric layer on the substrate between the sacrificial epitaxy region extending from adjacent fins of the first and second transistors; and removing the sacrificial epitaxy region extending from the fins of the first transistor and extending from fins of the second transistor.

16. The method according to claim 15, further comprising growing a first epitaxy region for the first transistor and a second epitaxy region for the second transistor in a space previously occupied by the removed sacrificial epitaxy region.

* * * * *